(12) United States Patent
Shintou et al.

(10) Patent No.: US 9,102,811 B2
(45) Date of Patent: Aug. 11, 2015

(54) PIGMENT DISPERSION, INK COMPOSITION INCLUDING PIGMENT DISPERSION, AND COLOR FILTER YELLOW RESIST COMPOSITION INCLUDING PIGMENT DISPERSION

(75) Inventors: Taichi Shintou, Saitama (JP); Yutaka Tani, Yokohama (JP); Masao Nakano, Kamakura (JP); Takayuki Ujifusa, Ashigarakami-gun (JP); Kaoru Takahashi, Saitama (JP); Satoshi Saito, Mishima (JP); Takeshi Miyazaki, Ebina (JP); Masashi Hirose, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/116,333

(22) PCT Filed: Apr. 23, 2012

(86) PCT No.: PCT/JP2012/061508
§ 371 (c)(1),
(2), (4) Date: Nov. 7, 2013

(87) PCT Pub. No.: WO2012/153669
PCT Pub. Date: Nov. 15, 2012

(65) Prior Publication Data
US 2014/0080063 A1    Mar. 20, 2014

(30) Foreign Application Priority Data

May 10, 2011   (JP) .................................. 2011-105270

(51) Int. Cl.
*C09D 11/322*   (2014.01)
*C08K 5/20*      (2006.01)
(Continued)

(52) U.S. Cl.
CPC ............... *C08K 5/3462* (2013.01); *C09B 57/04* (2013.01); *C09B 67/009* (2013.01);
(Continued)

(58) Field of Classification Search
CPC ...... C09D 11/322; C08K 5/20; C08K 5/3462; C09B 57/04; G02B 5/223
USPC .............................................. 106/31.77, 498
See application file for complete search history.

(56) References Cited

U.S. PATENT DOCUMENTS 6,860,930 B2 * 3/2005 Wu et al. .................... 106/31.29
8,075,683 B2 * 12/2011 Hainz et al. .................. 106/498
(Continued)

FOREIGN PATENT DOCUMENTS

JP   56-136848 A    10/1981
JP   2001-040256 A  2/2001
(Continued)

*Primary Examiner* — Helene Klemanski
(74) *Attorney, Agent, or Firm* — Canon U.S.A. Inc., IP Division

(57) ABSTRACT

The present invention provides a pigment dispersion excellent in dispersibility. Furthermore, the present invention provides a color filter yellow resist composition and an ink composition, which include the pigment dispersion. A pigment dispersion containing at least a compound represented by General formula (1) and a yellow pigment represented by General formula (2) in a dispersion medium and a method for manufacturing the same are provided. Furthermore, a color filter yellow resist composition and an ink composition are provided, wherein images can be displayed with high spectral characteristics and high display contrast because the brightness is high and the hue of yellow is excellent.

7 Claims, 2 Drawing Sheets

(51) Int. Cl.
*C08K 5/3462* (2006.01)
*C09B 57/04* (2006.01)
*C09B 67/46* (2006.01)
*G03F 7/00* (2006.01)
*C09D 7/02* (2006.01)
*C09D 17/00* (2006.01)
*G03F 7/027* (2006.01)
*G03F 7/105* (2006.01)
*C09D 11/00* (2014.01)
*G02B 5/22* (2006.01)

(52) U.S. Cl.
CPC ............ *C09B 67/0089* (2013.01); *C09D 7/02* (2013.01); *C09D 11/00* (2013.01); *C09D 11/322* (2013.01); *C09D 17/003* (2013.01); *G03F 7/0007* (2013.01); *G03F 7/027* (2013.01); *G03F 7/105* (2013.01); *C08K 5/20* (2013.01); *G02B 5/223* (2013.01)

(56) References Cited

U.S. PATENT DOCUMENTS

| | | | |
|---|---|---|---|
| 8,603,711 B2 * | 12/2013 | Tani et al. | 106/496 |
| 2004/0261656 A1 | 12/2004 | Wu et al. | |
| 2007/0066687 A1 * | 3/2007 | Kitagawa et al. | 514/616 |
| 2010/0003612 A1 * | 1/2010 | Loebel et al. | 106/31.77 |
| 2011/0023754 A1 * | 2/2011 | Hainz et al. | 106/498 |
| 2011/0146537 A1 * | 6/2011 | Goredema et al. | 106/311 |
| 2014/0080049 A1 * | 3/2014 | Ujifusa et al. | 430/108.21 |

FOREIGN PATENT DOCUMENTS

| | | |
|---|---|---|
| JP | 2007-112919 A | 5/2007 |
| JP | 2007-197566 A | 8/2007 |
| JP | 2008-274126 A | 11/2008 |
| JP | 2009-120777 A | 6/2009 |
| JP | 2010-111761 A | 5/2010 |
| JP | 2012-246377 A | 12/2012 |
| JP | 2013-010811 A | 1/2013 |
| WO | 2013/002294 A1 | 1/2013 |

\* cited by examiner

PIGMENT DISPERSION, INK COMPOSITION INCLUDING PIGMENT DISPERSION, AND COLOR FILTER YELLOW RESIST COMPOSITION INCLUDING PIGMENT DISPERSION

TECHNICAL FIELD

The present invention relates to a pigment dispersion used in production processes of a paint, an ink, a toner, a color filter, a resin molded article, and the like. Furthermore, the present invention relates to an ink composition and a yellow resist composition for a color filter (hereafter referred to as a color filter yellow resist composition), which include the pigment dispersion as a colorant.

BACKGROUND ART

In recent years, along with the spread of color images, demands for higher image quality of the color image have increased. Regarding a digital full-color copier or printer, a color image document is subjected to color separation with a color filter of each of blue, green, and red and, thereafter, a latent image corresponding to the original image is developed by using a color toner of each of yellow, magenta, cyan, and black. Therefore, the coloring power of a colorant in each color toner exerts a significant influence on the image quality. However, in general, regarding dispersion of a pigment into various media, it is difficult to make the pigment fine sufficiently and disperse the pigment uniformly.

Examples of yellow pigments having high transparency, a high coloring power, and excellent weatherability include pigments having an isoindoline skeleton, e.g., C. I. Pigment Yellow 185. However, regarding such a pigment, autoagglutination occurs easily, and a sufficient dispersion state is not obtained. Consequently, there is a problem in that a performance intrinsic to the pigment with respect to the transparency and the saturation is not delivered sufficiently.

In order to solve the above-described problem, PTL 1 describes a pigment dispersion liquid containing a pigment derivative in which a sulfonic acid group is introduced into an isoindoline based pigment. However, the dispersibility of the pigment still has room for improvement.

CITATION LIST

Patent Literature

PTL 1 Japanese Patent Laid-Open No. 2007-112919

SUMMARY OF INVENTION

Technical Problem

The present invention provides a pigment dispersion excellent in pigment dispersibility. Furthermore, the present invention provides an ink composition and a color filter yellow resist composition, which include the pigment dispersion.

Solution to Problem

The present invention relates to a pigment dispersion containing a compound represented by General formula (1) and a yellow pigment represented by General formula (2) in a dispersion medium. Furthermore, the present invention relates to an ink composition containing the pigment dispersion and a color filter yellow resist composition containing the pigment dispersion.

Advantageous Effects of Invention

According to the present invention, a pigment dispersion excellent in dispersibility can be provided. Furthermore, an ink composition and a color filter resist composition, which have a good yellow color tone, can be provided by using the pigment dispersion.

DESCRIPTION OF EMBODIMENTS

Figure 1:
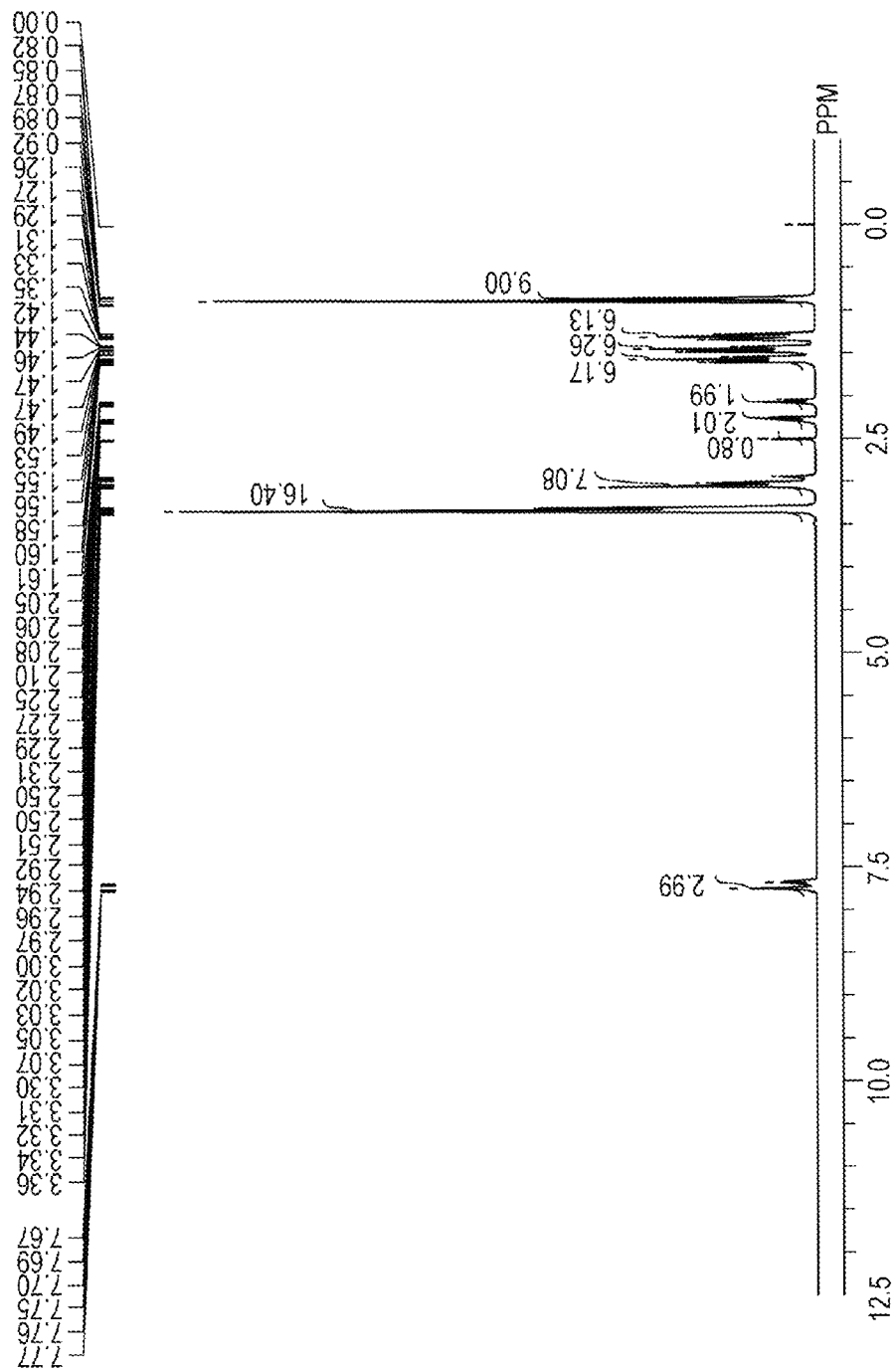
FIG. 1 is a diagram showing a $^1$H NMR spectrum of Compound (7) represented by General formula (1) in DMSO-$d_6$ at room temperature and 400 MHz.

In order to solve the above-described problems in related art, the present inventors performed intensive research. As a result, it was found that excellent pigment dispersibility was exhibited by a pigment dispersion containing a compound represented by General formula (1) and a yellow pigment represented by General formula (2) in a dispersion medium. Furthermore, it was found that the a good yellow color tone was obtained by using the pigment dispersion for an ink composition and a color filter resist composition.

[Chem. 1]

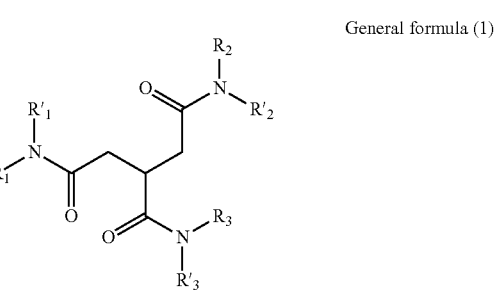

General formula (1)

[Chem. 2]

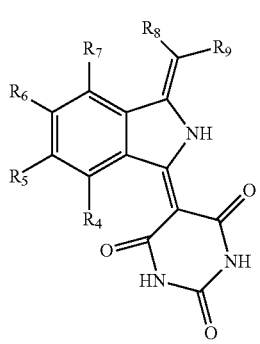

General formula (2)

In General formula (1), $R_1$ to $R_3$ and $R'_1$ to $R'_3$ represent independently a hydrogen atom, an alkyl group, an aryl group, or an aralkyl group. The alkyl group, the aryl group and the aralkyl group may have a substituent.

The alkyl group as $R_1$ to $R_3$ and $R'_1$ to $R'_3$ in General formula (1) is not specifically limited, and examples thereof include straight chain, branched, and cyclic alkyl groups having the carbon number of 1 to 20, e.g., a methyl group, a butyl group, an octyl group, a dodecyl group, a nonadecyl group, a cyclobutyl group, a cyclopentyl group, a cyclohexyl group, a methylcyclohexyl group, and an ethylhexyl group.

The aryl group as $R_1$ to $R_3$ and $R'_1$ to $R'_3$ in General formula (1) is not specifically limited, and examples thereof include 6 to 14 membered monocyclic and polycyclic aryl groups, e.g., a phenyl group and a naphthyl group.

The aralkyl group as $R_1$ to $R_3$ and $R'_1$ to $R'_3$ in General formula (1) is not specifically limited, and examples thereof include a benzyl group and a phenethyl group.

Although $R_1$ to $R_3$ and $R'_1$ to $R'_3$ in General formula (1) represent the above-described functional groups, these functional groups may further have a substituent within the bound of not significantly impairing the stability of the compound. In this case, examples thereof include alkyl groups, e.g., a methyl group, an ethyl group, a propyl group, and a butyl group; aryl groups, e.g., a phenyl group; alkoxy groups, e.g., a methoxy group, an ethoxy group, and a butoxy group; monosubstituted amino groups, e.g., a methylamino group and a propylamino group; disubstituted amino groups, e.g., a dimethylamino group, a dipropylamino group, and a N-ethyl-N-phenyl group, and a carboxyl group.

In General formula (1), $R_1$, $R_2$, and $R_3$ can be the same substituent and $R'_1$, $R'_2$, and $R'_3$ can be the same substituent. This is because in the case where $R_1$, $R_2$, and $R_3$ are the same substituent and $R'_1$, $R'_2$, and $R'_3$ are the same substituent, the compound represented by General formula (1) is produced easily and, thereby, cost reduction is expected.

In General formula (1), $R_1$ to $R_3$ can be an alkyl group. This is because the solubility of the compound represented by General formula (1) into a solvent and the like is improved and, thereby, the dispersibility of the pigment can be improved. In particular, $R_1$ to $R_3$ in General formula (1) can include a branched or cyclic substituent, e.g., a cyclohexyl group, a methylcyclohexyl group, and an ethylhexyl group, or have a structure, such as, a butoxypropyl group. Meanwhile, $R'_1$ to $R'_3$ in General formula (1) can be a hydrogen atom.

Concrete examples of the compounds used in the present invention and represented by General formula (1) are as described below. In this regard, the compounds represented by General formula (1) are not limited to the examples described below.

[Chem. 3]

Compound (1)

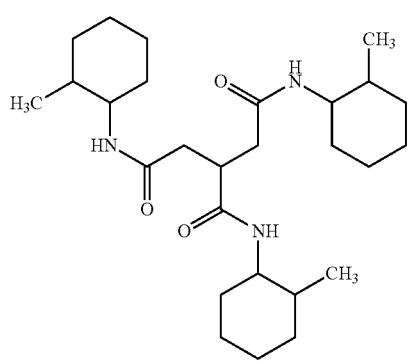

Compound (2)

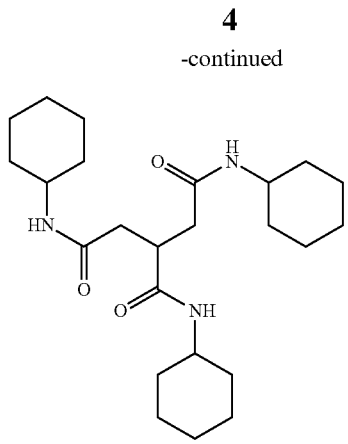

Compound (3)

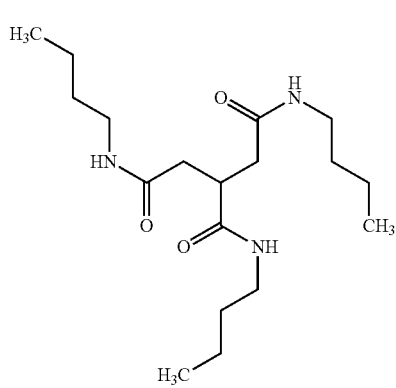

Compound (4)

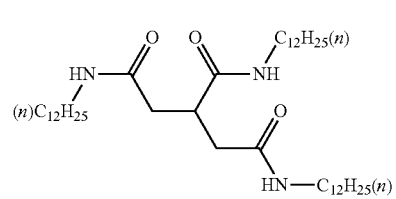

Compound (5)

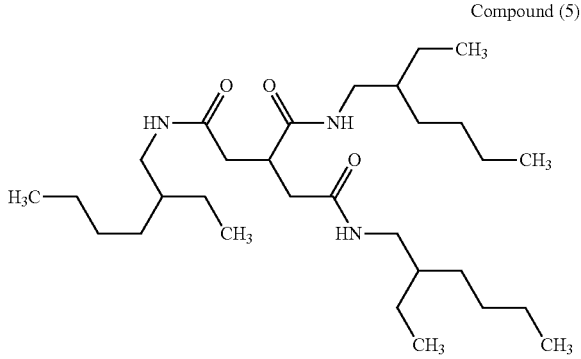

Compound (6)

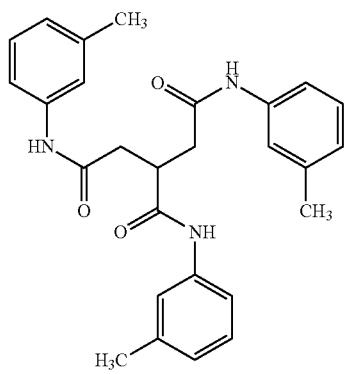

Compound (7)
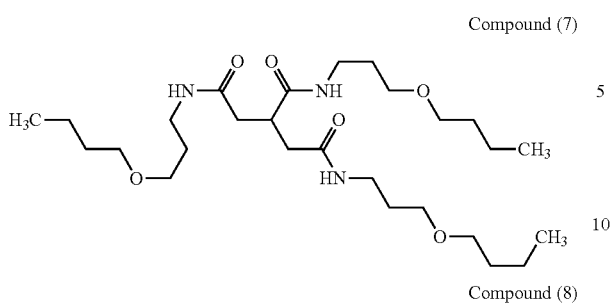

Compound (8)
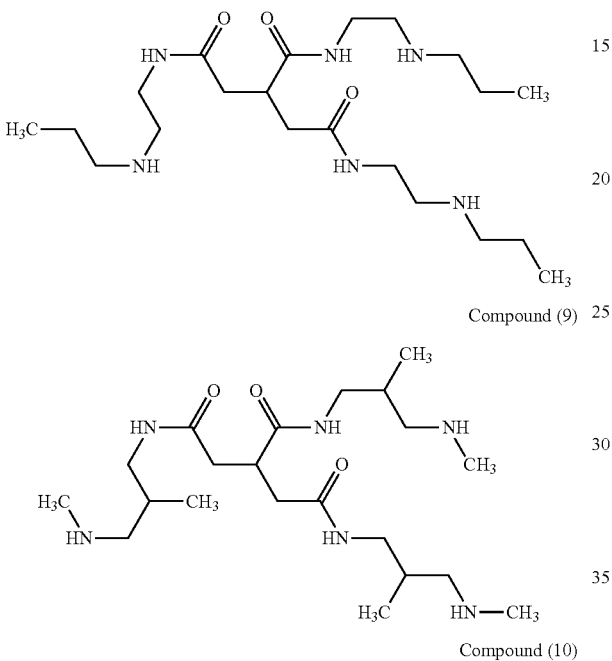

Compound (9)

Compound (10)
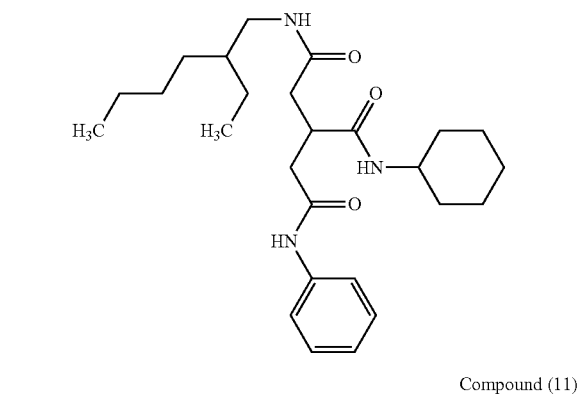

Compound (11)
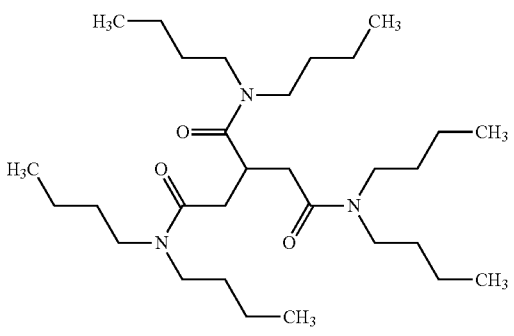

Compound (12)
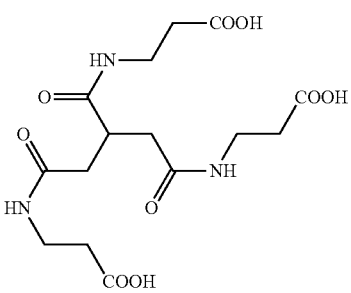

Compound (13)
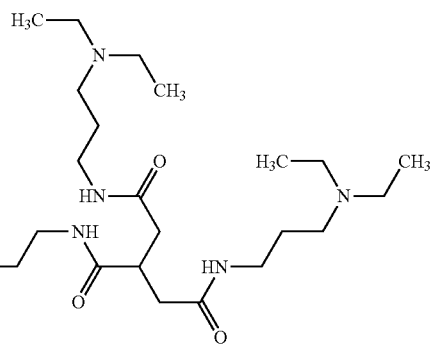

Particularly high effects are obtained in the case where an alkyl group having a ring structure, e.g., Compound (1) or Compound (2), is included as $R_1$ to $R_3$ in General formula (1), in the case where an alkyl group having a branched structure, e.g., Compound (5), is included, and in the case where an alkyl group having a coordinating heteroatom (oxygen atom or the like), e.g., Compound (7), is included.

Next, an aspect of a method for manufacturing the compound represented by General formula (1) will be described below. That is, Compound B can be obtained by condensing Compound A and an amine or an amine derivative. Furthermore, Compound C can be obtained by condensing Compound B and the same amine or amine derivative as that described above. Meanwhile, as necessary, known reactions, e.g., a protection-deprotection reaction and hydrolysis, can be applied to functional groups of the individual compounds. In this regard, the method for manufacturing the compound represented by General formula (1) is not limited to this.

[Chem. 4]

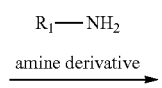

Compound A

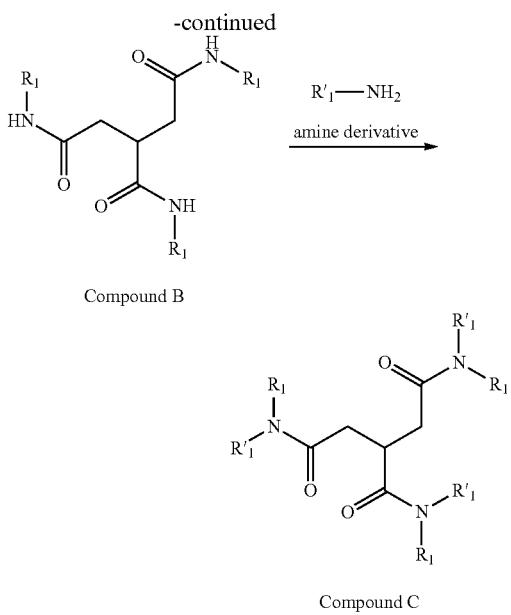

Compound B

Compound C

In General formula (2) described above, $R_4$ to $R_7$ represent independently a hydrogen atom, a halogen atom, a sulfonic acid, a sulfonic acid ester group, a sulfonic acid amide group, a sulfonate, a carboxylic acid, a carboxylic acid ester group, a carboxylic acid amide group, or a carboxylate, $R_8$ and $R_9$ represent independently a hydrogen atom, a cyano group, a carboxylic acid, a carboxylic acid ester group, a carboxylic acid amide group, a carboxylate, or a heterocyclic group, and $R_7$ and $R_8$ may be bonded to each other to form a ring or $R_8$ and $R_9$ may be bonded to each other to form a ring.

In General formula (2) described above, examples of halogen atoms as $R_4$ to $R_7$ include a fluorine atom, a chlorine atom, a bromine atom, and an iodine atom.

In General formula (2) described above, the sulfonic acid ester group as $R_4$ to $R_7$ is not specifically limited, and examples thereof include a sulfonic acid methyl ester group, a sulfonic acid ethyl ester group, a sulfonic acid propyl ester group, and a sulfonic acid butyl ester group.

In General formula (2) described above, the sulfonic acid amide group as $R_4$ to $R_7$ is not specifically limited, and examples thereof include monosubstituted amide groups, e.g., a sulfamoyl group, a sulfonic acid methylamide group, a sulfonic acid butylamide group, a sulfonic acid hexylamide group, and a sulfonic acid phenylamide group; and disubstituted amide groups, e.g., sulfonic acid dimethylamide group, a sulfonic acid diphenylamide group, and a sulfonic acid methylpropylamide group.

In General formula (2) described above, the sulfonate as $R_4$ to $R_7$ is not specifically limited, and examples thereof include alkali metal salts, e.g., sodium salts and potassium salts; alkaline-earth salts, e.g., magnesium salts and calcium salts; amine salts, e.g., ammonium salts, pyridinium salts, piperidinium salts, and triethylammonium salts; and amino acid salts, e.g., tryptophan salts, lysine salts, leucine salts, phenylalanine salts, valine salts, and arginine salts.

In General formula (2) described above, the carboxylic acid ester group as $R_4$ to $R_9$ is not specifically limited, and examples thereof include a carboxylic acid methyl ester group, a carboxylic acid ethyl ester group, a carboxylic acid propyl ester group, and a carboxylic acid butyl ester group.

In General formula (2) described above, the carboxylic acid amide group as $R_4$ to $R_9$ is not specifically limited, and examples thereof include monosubstituted amide groups, e.g., a carbamoyl group, a carboxylic acid methylamide group, a carboxylic acid butylamide group, a carboxylic acid hexylamide group, and a carboxylic acid phenylamide group; and disubstituted amide groups, e.g., a carboxylic acid dimethylamide group, a carboxylic acid diphenylamide group, and a carboxylic acid methylpropylamide group.

In General formula (2) described above, the carboxylate as $R_4$ to $R_9$ is not specifically limited, and examples thereof include alkali metal salts, e.g., sodium salts and potassium salts; alkaline-earth salts, e.g., magnesium salts and calcium salts; amine salts, e.g., ammonium salts, pyridinium salts, piperidinium salts, and triethylammonium salts; and amino acid salts, e.g., tryptophan salts, lysine salts, leucine salts, phenylalanine salts, valine salts, and arginine salts.

In General formula (2) described above, the heterocyclic group as $R_8$ and $R_9$ is not specifically limited, and examples thereof include 4 to 10 membered monocyclic or bicyclic heterocyclic groups having 1 to 4 atoms selected from the group consisting of nitrogen, oxygen, and sulfur. Concrete examples of heterocyclic groups include a pyridyl group, a pyrazinyl group, a pyrimidinyl group, a pyrrolyl group, a thienyl group, a furyl group, a pyranyl group, an oxazolyl group, a thiazolyl group, a triazolyl group, a tetrazolyl group, an imidazolyl group, a pyrazolyl group, a morpholinyl group, a thiomorpholinyl group, a piperidinyl group, a piperazinyl group, a quinolyl group, an isoquinolyl group, an indolyl group, an isoindolyl group, a benzofuryl group, and a benzothienyl group.

The yellow pigment represented by General formula (2), used in the present invention can be at least one type of yellow pigment selected from the group consisting of C. I. Pigment Yellow 139 and C. I. Pigment Yellow 185. In particular, C. I. Pigment Yellow 185 can be employed because a coloring power is high. These yellow pigments can be used alone or in combination with known yellow pigments or dyes.

Regarding Pigment Dispersion

The pigment dispersion according to the present invention will be described. A dispersion medium in the present invention refers to water, an organic solvent, or a mixture thereof.

The pigment dispersion according to the present invention is obtained by performing a treatment to disperse the compound represented by General formula (1) and the yellow pigment represented by General formula (2) into a dispersion medium. Concretely, the following method is mentioned, for example. The compound represented by General formula (1) and, as necessary, a polymer are dissolved into the dispersion medium, and a powder of the pigment represented by General formula (2) is added to the dispersion medium gradually, while agitation is performed, so as to enhance the affinity with the dispersion medium sufficiently. Furthermore, the pigment can be dispersed finely into a stable uniform fine particle state by applying a mechanical shearing force with a dispersing machine, e.g., a ball mill, a paint shaker, a dissolver, an attritor, a sand mill, or a high-speed mill.

The amount of yellow pigment in the pigment dispersion is preferably 1.0 to 30.0 parts by mass relative to 100 parts by mass of dispersion medium, more preferably 2.0 to 20.0 parts by mass, and in particular 3.0 to 15.0 parts by mass. In the case where the content of the yellow pigment is within the above-described range, an increase in viscosity and degradation in pigment dispersibility can be prevented and a good coloring power can be delivered.

The content of the compound represented by General formula (1) is preferably 0.05 to 10 parts by mass relative to 100 parts by mass of yellow pigment represented by General formula (2), and more preferably 0.1 to 5 parts by mass.

Regarding the pigment dispersion, dispersion into water can be performed by using an emulsifier. Examples of emulsifiers include cationic surfactants, anionic surfactants, and nonionic surfactants. Examples of cationic surfactants include dodecylammonium chloride, dodecylammonium bromide, dodecyltrimethylammonium bromide, dodecylpyridinium chloride, dodecylpyridinium bromide, and hexadecyltrimethylammonium bromide. Examples of anionic surfactants include fatty acid soap, e.g., sodium stearate and sodium dodecanoate, sodium dodecyl sulfate, sodium dodecyl benzene sulfate, and sodium lauryl sulfate. Examples of nonionic surfactants include dodecyl polyoxyethylene ether, hexadecyl polyoxyethylene ether, nonylphenyl polyoxyethylene ether, lauryl polyoxyethylene ether, sorbitan monooleate polyoxyethylene ether, and monodecanoyl sucrose.

Organic solvents usable as the dispersion medium include alcohols, e.g., methyl alcohol, ethyl alcohol, denatured ethyl alcohol, isopropyl alcohol, n-butyl alcohol, isobutyl alcohol, tert-butyl alcohol, sec-butyl alcohol, tert-amyl alcohol, 3-pentanol, octyl alcohol, benzyl alcohol, and cyclohexanol; glycols, e.g., methyl cellosolve, ethyl cellosolve, diethylene glycol, and diethylene glycol monobutyl ether; ketones, e.g., acetone, methyl ethyl ketone, and methyl isobutyl ketone; esters, e.g., ethyl acetate, butyl acetate, ethyl propionate, and cellosolve acetate; hydrocarbon based solvents, e.g., hexane, octane, petroleum ether, cyclohexane, benzene, toluene, and xylene; halogenated hydrocarbon based solvents, e.g., carbon tetrachloride, trichloroethylene, and tetrabromoethane; ethers, e.g., diethyl ether, dimethyl glycol, trioxane, and tetrahydrofuran; acetals, e.g., methylal and diethyl acetal; organic acids, e.g., formic acid, acetic acid, and propionic acid; and sulfur.nitrogen-containing organic compounds, e.g., nitrobenzene, dimethylamine, monoethanolamine, pyridine, dimethyl sulfoxide, and dimethylformamide.

Alternatively, polymerizable monomers can also be used as the organic solvent. The polymerizable monomer is an addition-polymerizable monomer or a polycondensable monomer and can be an addition-polymerizable monomer. Concrete examples can include styrene based monomers, e.g., styrene, o- (m-, p-) methylstyrene and o- (m-, p-) ethylstyrene; acrylate based monomers, e.g., methyl acrylate, ethyl acrylate, propyl acrylate, butyl acrylate, octyl acrylate, dodecyl acrylate, stearyl acrylate, behenyl acrylate, 2-ethylhexyl acrylate, dimethylaminoethyl acrylate, diethylaminoethyl acrylate, acrylonitrile, and acrylic acid amide; methacrylate based monomers, e.g., methyl methacrylate, ethyl methacrylate, propyl methacrylate, butyl methacrylate, octyl methacrylate, dodecyl methacrylate, stearyl methacrylate, behenyl methacrylate, 2-ethylhexyl methacrylate, dimethylaminoethyl methacrylate, diethylaminoethyl methacrylate, methacrylonitrile, and methacrylic acid amide; olefin based monomers, e.g., ethylene, propylene, butylene, butadiene, isoprene, isobutylene, and cyclohexene; vinyl halides, e.g., vinyl chloride, vinylidene chloride, vinyl bromide, and vinyl iodide; vinyl esters, e.g., vinyl acetate, vinyl propionate, and vinyl benzoate; vinyl ethers, e.g., vinyl methyl ether, vinyl ethyl ether, and vinyl isobutyl ether; and vinyl ketone compounds, e.g., vinyl methyl ketone, vinylhexyl ketone, and methyl isopropenyl ketone. They can be used alone or at least two types can be used in combination in accordance with the application purposes. In the case where a polymerized toner is produced by using the pigment dispersion according to the present invention, among the above-described polymerizable monomers, styrene or a styrene based monomer can be used alone or in combination with the other polymerizable monomer. In particular, styrene can be used because of easiness in handling.

A polymer may be further added to the pigment dispersion. Concrete examples include polystyrene polymers, styrene copolymers, polyacrylic acid polymers, polymethacrylic acid polymers, polyacrylic acid ester polymers, polymethacrylic acid ester polymers, acrylic acid based copolymers, methacrylic acid based copolymers, polyester polymers, polyvinyl ether polymers, polyvinyl methyl ether polymers, polyvinyl alcohol polymers, polyvinyl butyral polymers, polyurethane polymers, and polypeptide polymers. these polymers can be used alone or at least two types can be used in combination.

Regarding the pigment dispersion according to the present invention, other colorants can be used in combination insofar as the dispersibility is not impaired. Examples of colorants usable in combination include various materials, e.g., compounds typified by condensed azo compounds, anthraquinone compounds, azo metal complexes, methine compounds, and allylamide compounds.

Regarding Ink

The pigment dispersion according to the present invention has a vivid color tone and can be used as a yellow colorant, in particular a material for recording image information, because of excellent spectral characteristics thereof. For example, in the case of the water based dispersion medium, the pigment dispersion can be used for a colorant of an ink for ink jet, an aqueous ink for printing, an aqueous paint, an aqueous ink for writing instruments, or the like. Meanwhile, in the case of the organic solvent based dispersion medium, the pigment dispersion can be used for a colorant of a resist composition for color filter, an oil based ink for printing, an oil based paint, an oil based ink for writing instruments, or the like.

In the case where the pigment dispersion according to the present invention is used for the ink composition, the dispersion medium contained in the pigment dispersion can be an aqueous medium. The aqueous medium may be water or a mixed solvent of water and a water-soluble organic solvent. The water-soluble organic solvent is not limited insofar as the water solubility is exhibited. Examples thereof include alcohols, polyhydric alcohols, polyethylene glycols, glycol ethers, nitrogen-containing polar solvents, and sulfur-containing polar solvents.

In the case where an ink containing the pigment dispersion according to the present invention is produced, the pH of the ink is not specifically limited, but the pH is preferably within the range of 4.0 to 11.0 in consideration of the safety. Meanwhile, in the case where an ink for ink jet is produced, in order to maintain the moisture retention of the ink, a moisture-retentive solid, e.g., urea, an urea derivative, or trimethylolpropane, may be used as a component of the ink. In general, the content of the moisture-retentive solid in the ink is preferably within the range of 0.1 percent by mass or more and 20.0 percent by mass or less relative to the ink, and more preferably within the range of 3.0 percent by mass or more and 10.0 percent by mass or less.

Moreover, the ink may contain various additives, e.g., a pH regulator, a rust inhibitor, an antiseptic, a fungicide, an antioxidant, a reduction inhibitor, a vaporization promoter, a chelating agent, and a water-soluble polymer, as necessary, besides the above-described components.

In particular, the ink containing the pigment dispersion according to the present invention is favorably used for an ink jet recoding system in which recording is performed by ejecting droplets through the action of thermal energy. In addition, it is also possible to use as inks applied to other ink jet recording methods and materials for common writing instruments.

Regarding Color Filter Yellow Resist Composition

The pigment dispersion according to the present invention has a vivid yellow color tone and can be used as a yellow coloring material, in particular a color filter colorant, because of spectral characteristics thereof. In general, a yellow resist composition contains a binder polymer, a photopolymerizable monomer, a photopolymerization initiator, a solvent, and the pigment dispersion according to the present invention.

Regarding a color filter formed by arranging at least two types of pixels having different spectral characteristics adjacently on a substrate, pixels having high transparency and high color purity can be obtained by using the pigment dispersion according to the present invention for at least one of the plurality of pixels (for example, red, green, and blue) thereof. Furthermore, the spectral characteristics can also be improved by mixing a dye and, therefore, a mixture of the pigment dispersion according to the present invention and the dye may be used. At least two types of dyes may be used in combination in order to obtain a desired hue.

The content of the pigment represented by General formula (2), used in the present invention, is preferably 0.1 to 400 percent by mass relative to the mass of binder polymer, and more preferably 1 to 200 percent by mass.

The binder polymer usable for the color filter yellow resist composition according to the present invention is not specifically limited insofar as the light-irradiated portion or the light-shielded portion can be dissolved by an organic solvent, an alkali aqueous solution, water, or a commercially available developing solution. Meanwhile, it is more desirable that the binder polymer has a composition which can be developed with water or alkali from the viewpoint of operability, waste treatment, and the like.

As for such a binder polymer, in general, binder polymers produced through copolymerization of a hydrophilic monomer typified by acrylic acid, methacrylic acid, 2-hydroxyethyl, acrylamide, N-vinyl pyrrolidone, and a monomer having an ammonium salt and a lipophilic monomer typified by acrylic acid esters, methacrylic acid esters, vinyl acetate, styrene, N-vinyl carbazole, and the like at an appropriate mixing ratio by a technique in related art are known. These binder polymers can be used as resists of negative type, that is, a type in which a light-shielded portion is removed through development, by being combined with a radical-polymerizable monomer having an ethylenic unsaturated group, a cationic-polymerizable monomer having an oxirane ring or an oxetane ring, a radical generator, an acid generator, or a base generator.

Alternatively, binder polymers typified by tert-butyl carbonic acid ester, tert-butyl ester, tetrahydroxypyranyl ester, or tetrahydroxypyranyl ether of polyhydroxystyrene can also be used. This type of binder polymer can be used as resists of positive type, that is, a type in which a light-irradiated portion is removed through development, by being combined with an acid generator.

The color filter yellow resist composition according to the present invention can contain a photopolymerizable monomer having at least one ethylenic unsaturated double bond, the monomer serving as a monomer having an ethylenic unsaturated double bond, which undergoes addition polymerization through irradiation with light. As for the above-described photopolymerizable monomer, a compound having at least one addition-polymerizable ethylenic unsaturated group in the molecule and having a boiling point of 100° C. or higher at normal pressure is mentioned. Examples thereof can include monofunctional acrylates, e.g., polyethylene glycol monoacrylate, polyethylene glycol monomethacrylate, polypropylene glycol monoacrylate, polypropylene glycol monomethacrylate, phenoxyethyl acrylate, and phenoxyethyl methacrylate; polyfunctional acrylates and methacrylates, e.g., polyethylene glycol diacrylate, polyethylene glycol dimethacrylate, polypropylene glycol diacrylate, polypropylene glycol dimethacrylate, trimethylolethane triacrylate, trimethylolethane trimethacrylate, trimethylolpropane triacrylate, trimethylolpropane trimethacrylate, trimethylolpropane diacrylate, trimethylolpropane dimethacrylate, neopentyl glycol diacrylate, neopentyl glycol dimethacrylate, pentaerythritol tetraacrylate, pentaerythritol tetramethacrylate, pentaerythritol triacrylate, pentaerythritol trimethacrylate, dipentaerythritol hexaacrylate, dipentaerythritol hexamethacrylate, dipentaerythritol pentaacrylate, dipentaerythritol pentamethacrylate, hexanediol diacrylate, hexanediol dimethacrylate, trimethylolpropane tri(acryloyloxypropyl)ether, tri(acryloyloxyethyl) isocyanurate, tri(acryloyloxyethyl)cyanurate, glycerin triacrylate, and glycerin trimethacrylate; and polyfunctional acrylates and polyfunctional methacrylates produced by, for example, adding ethylene oxide or propylene oxide to a polyfunctional alcohol, e.g., trimethylolpropane or glycerin, and thereafter, effecting acrylation or methacrylation.

Furthermore, polyfunctional acrylates and methacrylates, e.g., urethane acrylates, polyester acrylates, and epoxy acrylates which are reaction products of epoxy polymers and acrylic acid or methacrylic acid, are mentioned. Among those described above, trimethylolpropane triacrylate, trimethylolpropane trimethacrylate, pentaerythritol tetraacrylate, pentaerythritol tetramethacrylate, dipentaerythritol hexaacrylate, dipentaerythritol hexamethacrylate, dipentaerythritol pentaacrylate, and dipentaerythritol pentamethacrylate, can be employed.

The above-described photopolymerizable monomers may be used alone or at least two types may be used in combination. In general, the content of the above-described photopolymerizable monomer is 5 to 50 percent by mass of the mass (total solid content) of colored photosensitive composition, and in particular, 10 to 40 percent by mass is preferable.

The color filter yellow resist composition having ultraviolet-curability is configured to contain a photopolymerization initiator. Examples of photopolymerization initiators include vicinal poly ketaldonyl compounds, α-carbonyl compounds, acyloin ethers, polynuclear quinone compounds, combinations of triallylimidazole dimer/p-aminophenyl ketone, and trioxadiazole compounds, and can include 2-benzyl-2-dimethylamino-1-(4-morphorinophenyl)butanone (Irgacure 369: trade name, Ciba Specialty Chemicals). Meanwhile, regarding formation of a pixel by using a colored resist, in the case where electron beams are used, the above-described photopolymerization initiator is not always necessary.

The color filter yellow resist composition contains a solvent to dissolve or disperse the above-described binder polymer, photopolymerizable monomer, photopolymerization initiator, colorant, and the like. Examples of usable solvents include cyclohexanone, ethylcellosolve acetate, butylcellosolve acetate, 1-methoxy-2-propyl acetate, diethylene glycol dimethyl ether, ethylbenzene, 1,2,4-trichlorobenzene, ethylene glycol diethyl ether, xylene, ethylcellosolve, methyl-n-amyl ketone, propylene glycol monomethyl ether, toluene, methyl ethyl ketone, ethyl acetate, methanol, ethanol, isopropyl alcohol, butanol, isobutyl ketone, and petroleum based solvent. They can be used alone or in combination.

EXAMPLES

In examples, "part" and "%" are on a mass basis unless otherwise specified. The obtained reaction products were identified with $^1$H and $^{13}$C nuclear magnetic resonance spectroscopic analysis (ECA-400, produced by JEOL LTD.) and LC/TOF MS (LC/MSD TOF, produced by Agilent Technologies).

Production of Compound Represented by General Formula (1)

As for compounds represented by General formula (1), Compounds (1), (4), (5), and (7) were obtained in the manner described below. In this regard, Compounds (1), (4), (5), and (7) in the present example correspond to Compounds (1), (4), (5), and (7) in concrete examples of compounds represented by General formula (1) described above.

As for Compound (1), a trade name "RiKACLEAR PC1" (produced by New Japan Chemical Co., Ltd.) was obtained and was used.

Production Example of Compound (4)

Addition of 44.5 g (240 mmol) of n-dodecylamine to a 150 ml xylene solution of 13.0 g (120 mmol) of cresol, 7.0 g (40 mmol) of 1,2,3-propanetricarboxylic acid, and 1.0 g (14.4 mmol) of boric oxide was performed, and heat-refluxing was performed for 6 hours to effect dehydration. After the reaction was completed, concentration was performed under reduced pressure and, then, suspension cleaning was performed with 150 mL of acetonitrile through agitation at 50° C. for 1 hour. Solids were filtrated, so as to obtain 10.0 g (yield 37%) of Compound (4).

Analytical Result of Compound (4)

[1] $^1$H NMR (400 MHz, DMSO-$d_6$, room temperature): δ [ppm]=0.85 (t, 9H, J=6.64 Hz), 1.17 (m, 60H), 2.50 (t, 11H, J=1.83 Hz), 7.64 (s, 1H), 8.03 (s, 1H), 10.8 (s, 1H)

[2] Mass analysis (ESI-TOF): m/z=676.6414 (M−H)$^-$

Production Example of Compound (5)

Production was performed in the same manner as in Production example 1 except that n-dodecylamine of Compound (1) in Production example 1 was changed to 2-ethylhexylamine, so as to obtain 7.3 g (yield 36%) of Compound (5).

Analytical Result of Compound (5)

[1] $^1$H NMR (400 MHz, DMSO-$d_6$, room temperature): δ [ppm]=0.80 (td, 9H, J=7.44, 3.51 Hz), 0.86 (t, 9H, J=6.87 Hz), 1.2 (t, 24H, 8.47 Hz), 1.32 (dd, 3H, J=11.7, 5.72 Hz), 2.10 (dd, 2H, J=14.7, 6.87 Hz), 2.32 (dd, 2H, J=14.9, 8.01 Hz), 2.50 (t, 1H, J=1.83 Hz), 2.96 (dtd, 6H, J=39.1, 13.1, 6.41 Hz), 7.60 (t, 1H, 6.00 Hz), 7.68 (t, 2H, 6.00 Hz)

[2] Mass analysis (ESI-TOF): m/z=508.4524 (M−H)$^-$

Production Example of Compound (7)

Production was performed in the same manner as in Production example 1 except that n-dodecylamine of Compound (1) in Production example 1 was changed to 3-butoxypropylamine, so as to obtain 4.8 g (yield 23%) of Compound (7).

Analytical Result of Compound (7)

[1] $^1$H NMR (400 MHz, DMSO-$d_6$, room temperature): δ [ppm]=0.92 to 0.82 (m, 9H), 1.3 (td, 6H, J=14.9, 7.48 Hz), 1.46 (dt, 6H, J=15.7, 5.95 Hz), 1.57 (td, 6H, J=13.3, 6.4 Hz), 2.07 (dd, 2H, J=14.7, 6.41 Hz), 2.28 (dd, 2H, J=14.7, 7.79 Hz), 2.5 (t, 1H, J=1.60 Hz), 2.99 (tt, 7H, J=22.4, 7.56 Hz), 3.36 to 3.30 (m, 12H), 7.72 (dt, 3H, J=29.5, 5.61 Hz)

[2] Mass analysis (ESI-TOF): m/z=514.3906 (M−H)$^-$

Production Example of Compound (11)

After 7.3 mL (100 mmol) of thionyl chloride was dropped into a 0.2 ml dimethylformamide solution of 3.5 g (20 mmol) of 1,2,3-propanetricarboxylic acid, agitation was performed at 90° C. for 2 hours. Subsequently, concentration was performed under reduced pressure, and dilution was performed with 40 mL of dichloromethane. The resulting solution was dropped into a 100 mL dichloromethane solution of 10 mL of triethylamine and 12.2 mL (72 mmol) of dibutylamine, and agitation was performed for 5 days. After the reaction was completed, dilution was performed with 400 mL of dichloromethane. Subsequently, washing was performed with water, 1 mol/L hydrochloric acid, saturated sodium hydrogen carbonate aqueous solution, and saturated saline solution. After an organic layer was concentrated under reduced pressure, refining was performed with silica gel column chromatography, so as to obtain 7.37 g (yield 72%) of Compound (11).

Analytical Result of Compound (11)

[1] $^1$H NMR (400 MHz, CDCl$_3$, room temperature): δ [ppm]=0.99 to 0.84 (m, 18H), 1.69 to 1.23 (m, 24H), 2.53 to 2.45 (m, 2H), 2.63 to 2.55 (m, 2H), 3.31 to 3.12 (m, 10H), 3.46 (t, 2H, J=8.01 Hz), 3.75 to 3.68 (m, 1H)

[2] Mass analysis (ESI-TOF): m/z=510.4699 (M+H)$^+$

Production Example of Compound (12)

A suspension of 19.4 g (126.3 mmol) of β-alanine hydrochloride in 150 mL of dichloromethane was prepared, 5.56 g (31.6 mmol) of 1,2,3-propanetricarboxylic acid, 13.9 mL (126.3 mmol) of N-methylmorpholine, and 24.2 g (126.3 mmol) of 1-ethyl-3-(3-dimethylaminopropyl)carbodiimide (EDCI) were added, and agitation was performed at room temperature for a night. After the reaction solution was diluted with 450 mL of dichloromethane, washing was performed with water, 1 mol/L hydrochloric acid, saturated sodium hydrogen carbonate aqueous solution, and saturated saline solution. After an organic layer was concentrated under reduced pressure, the residue was washed with ethanol and diethyl ether, so as to obtain 11.2 g (yield 75%) of Compound (12).

Analytical Result of Compound (12)

[1] $^1$H NMR (400 MHz, CDCl$_3$, room temperature): δ [ppm]=2.07 (dd, 2H, J=14.88, 6.64 Hz), 2.31 (ddd, 8H, J=32.06, 15.57, 8.70 Hz), 2.96 to 2.88 (m, 1H), 3.20 (tt, 6H, J=19.23, 6.56 Hz), 7.75 (t, 1H, J=5.72 Hz), 7.85 (t, 2H, J=5.50 Hz), 12.19 (s, 3H)

[2] Mass analysis (ESI-TOF): m/z=388.1697 (M+H)$^+$

Production Example of Compound (13)

After 12.6 mL (80 mmol) of N,N-diethyl-1,3-diaminopropane and 22.1 g (80 mmol) of 4-(4,6-dimethoxy-1,3,5-triazin-2-yl)-4-methylmorpholinium chloride (DMT-MM) were added to a 80 ml methanol solution of 3.5 g (20 mmol) of 1,2,3-propanetricarboxylic acid, agitation was performed at room temperature for 3 days. The reaction solution was concentrated under reduced pressure and, thereafter, refining was performed with silica gel column chromatography, so as to obtain 2.1 g (yield 20%) of Compound (13).

Analytical Result of Compound (13)

[1] $^1$H NMR (400 MHz, CDCl$_3$, room temperature): δ [ppm]=1.02 (tt, 18H, J=15.57, 6.49 Hz), 1.62 (dt, 6H, J=17.71, 5.38 Hz), 2.17 (s, 2H), 2.35 (dd, 2H, J=14.65, 5.04

Hz), 2.54 to 2.44 (m, 18H), 3.14 to 3.10 (m, 1H), 3.28 (dq, 6H, J=25.87, 6.56 Hz), 7.56 (3H, t, J=5.27 Hz)

[2] Mass analysis (ESI-TOF): m/z=513.4603 (M+H)$^+$

Production of Pigment Dispersion

Example 1

Pigment dispersion (1) was obtained by mixing 48 parts of polyester polymer and 120 parts of ethyl acetate with a mixture of 6 parts of C. I. Pigment Yellow 185 (trade name "PALIOTOL Yellow D1155" produced by BASF) and 0.06 parts of Compound (1) and performing dispersion for 3 hours with an attritor (produced by MITSUI MINING COMPANY, LIMITED).

Examples 2 and 3

Pigment dispersions (2) and (3) were obtained in the same manner as in Example 1 except that ethyl acetate was changed to toluene and ethyl methyl ketone, respectively, in Example 1.

Example 4

Pigment dispersion (4) was obtained by mixing 120 parts of styrene with a mixture of 12 parts of C. I. Pigment Yellow 185 (trade name "PALIOTOL Yellow D1155" produced by BASF) and 0.12 parts of Compound (1) and performing dispersion for 3 hours with an attritor (produced by MITSUI MINING COMPANY, LIMITED).

Examples 5 to 7

Pigment dispersions (5) to (7) were obtained in the same manner as in Example 4 except that usage of Compound (1) was changed to 0.36 parts, 0.60 parts, and 1.2 parts, respectively, in Example 4.

Example 8

Pigment dispersion (8) was obtained in the same manner as in Example 4 except that styrene was changed to cyclohexanone in Example 4.

Example 9

Pigment dispersion (9) was obtained in the same manner as in Example 1 except that C. I. Pigment Yellow 139 was used instead of C. I. Pigment Yellow 185 and ethyl acetate was changed to toluene in Example 1.

Examples 10 to 15

Pigment dispersions (10) to (15) were obtained in the same manner as in Example 4 except that Compound (4), Compound (5), Compound (7), Compound (11), Compound (12), and Compound (13), respectively, were used instead of Compound (1) in Example 4.

Example 16

Pigment dispersion (16) was obtained by mixing 60 parts of water with a mixture of 6 parts of C. I. Pigment Yellow 185 (trade name "PALIOTOL Yellow D1155" produced by BASF), 0.06 parts of Compound (1), and 1.2 parts of sodium dodecyl sulfate and performing dispersion for 3 hours with an attritor (produced by MITSUI MINING COMPANY, LIMITED).

Examples 17 and 18

Pigment dispersions (17) and (18) were obtained in the same manner as in Example 16 except that Compound (11) and Compound (13), respectively, were used instead of Compound (1) in Example 16.

Example 19

Pigment dispersion (19) was obtained in the same manner as in Example 4 except that an ethyl acetate/toluene (60 parts/60 parts) mixture was used instead of styrene in Example 4.

Examples 20 and 21

Pigment dispersions (20) and (21) were obtained in the same manner as in Example 19 except that Compound (5) and Compound (12), respectively, were used instead of Compound (1) in Example 19.

Example 22

Pigment dispersion (22) was obtained in the same manner as in Example 4 except that Compound (7) was used instead of Compound (1) and a styrene/xylene (70 parts/50 parts) mixture was used instead of styrene in Example 4.

Comparative Examples 1 to 3

Pigment dispersions (23) to (25) were obtained in the same manners as in Examples 1 to 3, respectively, except that Compound (1) was not added in Examples 1 to 3.

Comparative Example 4

Pigment dispersion (26) was obtained in the same manner as in Example 4 except that Compound (1) was not added in Example 4.

Comparative Example 5

Pigment dispersion (27) was obtained in the same manner as in Example 8 except that Compound (1) was not added in Example 8.

Comparative Example 6

Pigment dispersion (28) was obtained in the same manner as in Example 9 except that Compound (1) was not added in Example 9.

Comparative Example 7

Pigment dispersion (29) was obtained in the same manner as in Example 16 except that Compound (1) was not added in Example 16.

Comparative Example 8

Pigment dispersion (30) was obtained in the same manner as in Example 19 except that Compound (1) was not added in Example 19.

Comparative Example 9

Pigment dispersion (31) was obtained in the same manner as in Example 22 except that Compound (7) was not added in Example 22.

Evaluation

Pigment dispersions (1) to (31) were evaluated as described below.

Dispersibility

The dispersibility of the pigment dispersion was evaluated. The dispersibility was determined by measuring the size of particles constituting the pigment with a particle size analyzer (Grind Meter) produced by TESTER SANGYO CO., LTD.

A: The size of particles constituting the pigment was less than 2.5 μm (the dispersibility was very good).
B: The size of particles constituting the pigment was 2.5 μm or more and less than 4.5 μm (the dispersibility was good).
C: The size of particles constituting the pigment was 4.5 μm or more (the dispersibility was poor).

Figure 2:
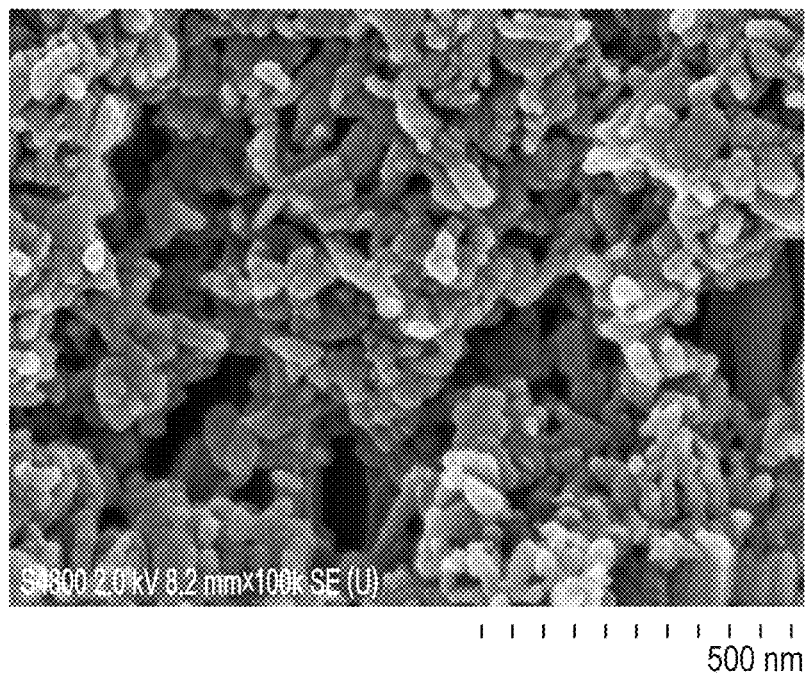
FIG. 2 is a diagram showing a SEM photograph of Pigment dispersion (4) in an example.

Furthermore, a sample prepared by developing the above-described pigment dispersion on an aluminum substrate and removing the solvent through natural drying was observed with a scanning electron microscope S-4800 (produced by Hitachi, Ltd.) under a magnification of 100,000 times, so as to examine the dispersibility. Regarding Pigment dispersion (4), the SEM photograph on the basis of observation by this method is shown in FIG. 2.

The evaluation results of the above-described examples of Pigment dispersions and the above-described comparative examples of Pigment dispersions are collectively shown in Table 1. PY 185 and PY 139 in Table 1 represent C. I. Pigment Yellow 185 and C. I. Pigment Yellow 139, respectively.

TABLE 1

| | Pigment dispersion | Pigment | Polymer | General formula (1) | Addition rate (%) | Solvent | Particle diameter (μm) | Dispersibility evaluation |
|---|---|---|---|---|---|---|---|---|
| Example 1 | (1) | PY185 | included | Compound (1) | 1 | ethyl acetate | 1.8 | A |
| Example 2 | (2) | PY185 | included | Compound (1) | 1 | toluene | 2.3 | A |
| Example 3 | (3) | PY185 | included | Compound (1) | 1 | ethyl methyl ketone | 2.4 | A |
| Example 4 | (4) | PY185 | none | Compound (1) | 1 | styrene | 2.0 | A |
| Example 5 | (5) | PY185 | none | Compound (1) | 3 | styrene | 2.1 | A |
| Example 6 | (6) | PY185 | none | Compound (1) | 5 | styrene | 2.3 | A |
| Example 7 | (7) | PY185 | none | Compound (1) | 10 | styrene | 2.3 | A |
| Example 8 | (8) | PY185 | none | Compound (1) | 1 | cyclohexanone | 2.3 | A |
| Example 9 | (9) | PY139 | included | Compound (1) | 1 | toluene | 2.0 | A |
| Example 10 | (10) | PY185 | none | Compound (4) | 1 | styrene | 2.3 | A |
| Example 11 | (11) | PY185 | none | Compound (5) | 1 | styrene | 2.3 | A |
| Example 12 | (12) | PY185 | none | Compound (7) | 1 | styrene | 1.6 | A |
| Example 13 | (13) | PY185 | none | Compound (11) | 1 | styrene | 1.8 | A |
| Example 14 | (14) | PY185 | none | Compound (12) | 1 | styrene | 2.0 | A |
| Example 15 | (15) | PY185 | none | Compound (13) | 1 | styrene | 1.9 | A |
| Example 16 | (16) | PY185 | none | Compound (1) | 1 | water | 2.0 | A |
| Example 17 | (17) | PY185 | none | Compound (11) | 1 | water | 2.1 | A |
| Example 18 | (18) | PY185 | none | Compound (13) | 1 | water | 2.1 | A |
| Example 19 | (19) | PY185 | none | Compound (1) | 1 | ethyl acetate/toluene (60/60) | 2.1 | A |
| Example 20 | (20) | PY185 | none | Compound (5) | 1 | ethyl acetate/toluene (60/60) | 2.3 | A |
| Example 21 | (21) | PY185 | none | Compound (12) | 1 | ethyl acetate/toluene (60/60) | 1.9 | A |
| Example 22 | (22) | PY185 | none | Compound (7) | 1 | styrene/xylene (70/50) | 1.8 | A |
| Comparative example 1 | (23) | PY185 | included | none | | ethyl acetate | 4.5 | C |
| Comparative example 2 | (24) | PY185 | included | none | | toluene | 4.2 | B |
| Comparative example 3 | (25) | PY185 | included | none | | ethyl methyl ketone | 4.8 | C |
| Comparative example 4 | (26) | PY185 | none | none | | styrene | 4.9 | C |
| Comparative example 5 | (27) | PY185 | none | none | | cyclohexanone | 5.2 | C |
| Comparative example 6 | (28) | PY139 | included | none | | toluene | 3.8 | B |
| Comparative example 7 | (29) | PY185 | none | none | | water | 6.0 | C |
| Comparative example 8 | (30) | PY185 | none | none | | ethyl acetate/toluene (60/60) | 5.2 | C |
| Comparative example 9 | (31) | PY185 | none | none | | styrene/xylene (70/50) | 4.2 | C |

As is clear from Table 1, the pigment dispersions of Examples 1 to 22 are excellent in dispersibility as compared with the pigment dispersions of Comparative examples corresponding thereto.

Preparation Example of Ink

Example 23

Ink (1) was produced by adding 1.0 parts of Acetylenol EH (produced by Kawaken Fine Chemicals Co., Ltd.), 7.5 parts of ethylene glycol, 7.5 parts of glycerin, and 7.5 parts of urea to 74.0 parts of Pigment dispersion (16) obtained in Example 16 and performing agitation sufficiently. Ink (1) was stood for 5 days and, thereafter, it was ascertained visually that a uniform state was kept.

Examples 24 and 25

Inks (2) and (3) were formed in the same manner as in Example 23 except that Pigment dispersions (17) and (18), respectively, were used instead of Pigment dispersion (16) in Example 23. Inks (2) and (3) were stood for 5 days and, thereafter, it was ascertained visually that a uniform state was kept.

Preparation Example of Comparative Ink (1)

Comparative ink (1) was obtained in the same manner as in Example 23 except that Compound (16) was changed to Pigment dispersion (29) in Example 23. Comparative ink (1) was stood for 5 days and, as a result, sedimentation of a yellow solid was observed visually.

As is clear from the above description, Ink (1) according to the present invention is excellent in dispersibility as compared with Comparative ink (1) corresponding thereto.

Preparation Example of Yellow Resist Composition

Example 26

After 22 parts of Pigment dispersion (8) obtained in Example 8 was added gradually to a 96 parts cyclohexanone solution of 6.7 parts of acrylic copolymer composition (weight average molecular weight 10,000), 1.3 parts of dipentaerythritol pentaacrylate, and 0.4 parts of 2-benzyl-2-dimethylamino-1-(4-morphorinophenyl)-butanone-1 (photopolymerization initiator) was performed gradually, where the acrylic copolymer composition was composed of 40 percent by mass of n-butyl methacrylate, 30 percent by mass of acrylic acid, and 30 percent by mass of hydroxyethyl methacrylate, and agitation was performed at room temperature for 3 hours. This was filtrated with a 1.5 μm filter, so as to obtain Yellow resist composition (1).

The yellow resist composition obtained as described above was applied to glass through spin coating. Thereafter, this was dried at 90° C. for 3 minutes, and the whole surface was exposed. Postcure was performed at 180° C. and, thereby, a visually uniform coating sample was able to be produced.

Example 27

Pigment dispersion (32) was obtained by mixing 120 parts of cyclohexanone with a mixture of 12 parts of C. I. Pigment Yellow 185 (trade name "PALIOTOL Yellow D1155" produced by BASF) and 0.12 parts of Compound (13) and performing dispersion for 3 hours with an attritor (produced by MITSUI MINING COMPANY, LIMITED). Yellow resist composition (2) was obtained in the same manner as in Example 26 except that Pigment dispersion (32) was used instead of Pigment dispersion (8).

The yellow resist composition obtained as described above was applied to glass through spin coating. Thereafter, this was dried at 90° C. for 3 minutes, and the whole surface was exposed. Postcure was performed at 180° C. and, thereby, a visually uniform coating sample was able to be produced.

It is clear that the pigments were dispersed favorably in Yellow resist compositions (1) and (2) because the uniform coating samples were able to be produced.

Preparation Example of Comparative Yellow Resist Composition (1)

The same operation as in Example 26 was performed except that Pigment dispersion (8) was changed to Pigment dispersion (27) in Example 26. However, a yellow resist composition was not able to be obtained because of clogging of a 1.5 μm filter.

It is clear that the dispersibility of the pigment was poor because clogging of the filter occurred.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-105270, filed May 10, 2011, which is hereby incorporated by reference herein in its entirety.

INDUSTRIAL APPLICABILITY

According to the present invention, a pigment dispersion excellent in colorant dispersibility in a dispersion medium can be provided. In the case where this pigment dispersion is used, a paint composition can be provided having excellent coating film performance, e.g., color developability of a pigment, finished appearance of a coating film, weatherability, and physical properties, good pigment dispersion stability, and capability of increasing a pigment concentration. Furthermore, in the case where this pigment dispersion is used, an ink composition can be provided having excellent clarity, transparency, color developability, and the like where the color developability and dispersion stability of a pigment are good. Meanwhile, it is also possible to use as colorants of toners, ink-jet inks, thermal transfer recording sheets, and color filters and coloring agents of optical recording media.

The invention claimed is:

1. A pigment dispersion comprising a compound represented by General formula (1) and a yellow pigment represented by General formula (2) in a dispersion medium General formula (1)

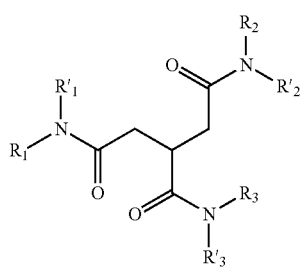

wherein in General formula (1), $R_1$, $R_2$, $R_3$, $R'_1$, $R'_2$, and $R'_3$ represent independently a hydrogen atom, an alkyl group, an aryl group, or an aralkyl group, wherein
the alkyl group, the aryl group and the aralkyl group may have a substituent;

General formula (2)

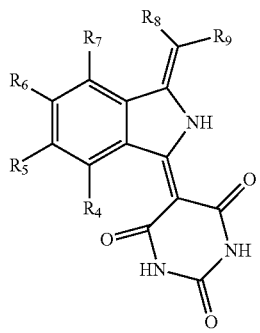

wherein in General formula (2), $R_4$ to $R_7$ represent independently a hydrogen atom, a halogen atom, a sulfonic acid, a sulfonic acid ester group, a sulfonic acid amide group, a sulfonate, a carboxylic acid, a carboxylic acid ester group, a carboxylic acid amide group, or a carboxylate, $R_8$ and $R_9$ represent independently a hydrogen atom, a cyano group, a carboxylic acid, a carboxylic acid ester group, a carboxylic acid amide group, a carboxylate, or a heterocyclic group, and $R_7$ and $R_8$ may be bonded to each other to form a ring or $R_8$ and $R_9$ may be bonded to each other to form a ring.

2. The pigment dispersion according to claim 1, wherein in General formula (1), $R_1$, $R_2$, and $R_3$ are the same functional group and $R'_1$, $R'_2$, and $R'_3$ are the same functional group.

3. The pigment dispersion according to claim 1, wherein in General formula (1), $R_1$, $R_2$, and $R_3$ are an alkyl group and $R'_1$, $R'_2$, and $R'_3$ are a hydrogen atom.

4. The pigment dispersion according to claim 1, wherein the yellow pigment represented by General formula (2) is at least one type of yellow pigment selected from the group consisting of C. I. Pigment Yellow 139 and C. I. Pigment Yellow 185.

5. The pigment dispersion according to claim 1, wherein the yellow pigment represented by General formula (2) is C. I. Pigment Yellow 185.

6. An ink composition comprising the pigment dispersion according to claim 1.

7. A color filter yellow resist composition comprising the pigment dispersion according to claim 1.

* * * * *